(12) United States Patent
Ki

(10) Patent No.: US 11,288,119 B2
(45) Date of Patent: Mar. 29, 2022

(54) KEY VALUE SSD

(71) Applicant: Samsung Electronics Co., Ltd., Suwon-si (KR)

(72) Inventor: Yang Seok Ki, Palo Alto, CA (US)

(73) Assignee: Samsung Electronics Co., Ltd., Suwon-si (KR)

(*) Notice: Subject to any disclaimer, the term of this patent is extended or adjusted under 35 U.S.C. 154(b) by 5 days.

(21) Appl. No.: 16/726,613

(22) Filed: Dec. 24, 2019

(65) Prior Publication Data

US 2020/0133770 A1  Apr. 30, 2020

Related U.S. Application Data

(63) Continuation of application No. 15/876,028, filed on Jan. 19, 2018, now Pat. No. 10,795,760.
(Continued)

(51) Int. Cl.
*G06F 11/10* (2006.01)
*H03M 13/15* (2006.01)
(Continued)

(52) U.S. Cl.
CPC .......... *G06F 11/1068* (2013.01); *G06F 3/064* (2013.01); *G06F 3/065* (2013.01); *G06F 3/0619* (2013.01); *G06F 3/0664* (2013.01); *G06F 3/0683* (2013.01); *G06F 11/108* (2013.01); *G11C 7/24* (2013.01); *H03M 13/154* (2013.01); *H03M 13/373* (2013.01); *H03M 13/3761* (2013.01); *G11C 29/52* (2013.01); *H03M 13/1515* (2013.01)

(58) Field of Classification Search
CPC .. G06F 11/1068; G06F 11/108; G06F 3/0683; G06F 3/064; G06F 3/065; G06F 3/0664; G06F 3/0619; G11C 7/24; G11C 29/52; H03M 13/373; H03M 13/3761; H03M 13/154; H03M 13/1515; H04L 9/0894
See application file for complete search history.

(56) References Cited

U.S. PATENT DOCUMENTS 7,487,289 B2   2/2009   Ito et al.
8,458,233 B2   6/2013   Gladwin et al.
(Continued)

FOREIGN PATENT DOCUMENTS

JP   2015-519674 A   7/2015
JP   2015-520588 A   7/2015
(Continued)

OTHER PUBLICATIONS

Office Action issued in U.S. Appl. No. 15/876,028 by the USPTO, dated Jun. 3, 2019, 33 pages.
(Continued)

*Primary Examiner* — Thien Nguyen
(74) *Attorney, Agent, or Firm* — Lewis Roca Rothgerber Christie LLP

(57) ABSTRACT

A storage device includes: a plurality of memory devices configured as a virtual device utilizing stateless data protection; and a virtual device layer configured to manage the virtual device to store objects by applying a first data protection to some of the objects and a second data protection to other ones of the objects depending on respective sizes of the objects.

25 Claims, 7 Drawing Sheets

Related U.S. Application Data

(60) Provisional application No. 62/562,219, filed on Sep. 22, 2017, provisional application No. 62/561,625, filed on Sep. 21, 2017, provisional application No. 62/474,039, filed on Mar. 20, 2017.

(51) Int. Cl.
*G06F 3/06* (2006.01)
*G11C 7/24* (2006.01)
*H03M 13/37* (2006.01)
*G11C 29/52* (2006.01)

(56) References Cited

U.S. PATENT DOCUMENTS

| | | | |
|---|---|---|---|
| 8,504,535 B1* | 8/2013 | He | G06F 16/9574 707/695 |
| 8,856,593 B2 | 10/2014 | Eckhardt et al. | |
| 8,904,047 B1 | 12/2014 | Kornfeld et al. | |
| 8,949,180 B1 | 2/2015 | Natanzon et al. | |
| 9,047,211 B2 | 6/2015 | Wood et al. | |
| 9,378,088 B1 | 6/2016 | Piszczek et al. | |
| 9,417,963 B2 | 8/2016 | He et al. | |
| 9,569,517 B1 | 2/2017 | Smola et al. | |
| 9,594,633 B2 | 3/2017 | Colgrove et al. | |
| 9,639,268 B2 | 5/2017 | Patterson, III | |
| 2002/0165942 A1 | 11/2002 | Ulrich et al. | |
| 2008/0010580 A1 | 1/2008 | Anderson et al. | |
| 2014/0136782 A1 | 5/2014 | Thomas | |
| 2015/0019937 A1* | 1/2015 | Baker | G06F 3/0632 714/769 |
| 2015/0149870 A1* | 5/2015 | Kozat | G06F 11/1096 714/772 |
| 2015/0302111 A1 | 10/2015 | Yue et al. | |
| 2015/0363269 A1* | 12/2015 | Baker | G06F 3/064 714/766 |
| 2016/0099810 A1 | 4/2016 | Li et al. | |
| 2017/0177266 A1 | 6/2017 | Doerner et al. | |
| 2017/0206135 A1 | 7/2017 | Zeng | |
| 2017/0272209 A1 | 9/2017 | Yanovsky et al. | |
| 2017/0308437 A1 | 10/2017 | Usvyatsky et al. | |
| 2017/0351575 A1 | 12/2017 | Baker et al. | |
| 2018/0262567 A1 | 9/2018 | Klein | |
| 2018/0314429 A1 | 11/2018 | Thomas | |
| 2019/0057140 A1 | 2/2019 | Pitchumani et al. | |

FOREIGN PATENT DOCUMENTS

| | | |
|---|---|---|
| JP | 2016-500183 A | 1/2016 |
| WO | 2016/137402 A1 | 9/2016 |

OTHER PUBLICATIONS

Office Action issued in U.S. Appl. No. 16/165,655 by the USPTO, dated Feb. 21, 2020, 10 pages.
Notice of Allowance issued in U.S. Appl. No. 15/876,028 by the USPTO, dated Sep. 25, 2019, 9 pages.
Wu, Chin-Hsien et al.; An Efficient B-Tree Layer for Flash-Memory Storage Systems, Department of Computer Science and Information Engineering, National Taiwan University, Taipei, Taiwan, 2003, 20 pages.
Final Office Action issued in U.S. Appl. No. 16/165,655 by the USPTO, dated Jun. 29, 2020, 12 pages.
U.S. Office Action dated Mar. 18, 2021, issued in U.S. Appl. No. 16/165,655 (12 pages).

* cited by examiner

KEY VALUE SSD

CROSS-REFERENCE TO RELATED APPLICATION(S)

This application is a continuation of U.S. patent application Ser. No. 15/876,028 filed on Jan. 19, 2018, which claims priority to and the benefit of U.S. Provisional Patent Application No. 62/474,039 filed Mar. 20, 2017 and titled KEY VALUE SSD, U.S. Provisional Patent Application No. 62/561,625 filed Sep. 21, 2017 and titled HYBRID STATELESS DATA PROTECTION METHOD AND SYSTEM FOR KEY VALUE STORAGES, and U.S. Provisional Patent Application No. 62/562,219 filed Sep. 22, 2017 and titled HYBRID STATELESS DATA PROTECTION METHOD AND SYSTEM FOR KEY VALUE STORAGES, the entire content of all three of which is incorporated herein by reference.

BACKGROUND

Traditional solid state drives (SSDs) typically use only a block interface and provides data reliability through redundant array of independent disks (RAID), ensure coding, or replication. As object formats become variable in size and unstructured, there is a desire for effective data conversion between object and block level interfaces. Further, it is desirable to ensure data reliability while maintaining space efficiency and fast access time characteristics.

SUMMARY

Example embodiments according to the present invention relate to key value storage systems (e.g., key value solid state drives) that are different from block devices.

Some example embodiments of the present invention relate to how data reliability can be implemented for key value SSDs. A hybrid of replication and erasure coding based on space overhead is applied to a group of key value SSDs, which can implement a stateless variable length erasure codes for objects.

Some example embodiments of the present invention have one or more of the following characteristics: 1) reliability is provided per a variable object, and not per a fixed block; 2) replication and erase coding can be mixed to implement a target reliability of objects for a single disk group; 3) space efficiency is primary metrics and performance is secondary metrics to determine a right technique for an object; 4) the mechanism is stateless similar to redundant array of independent disks (RAID); 5) no extra information is required to be stored for either replication or erase coding; and 6) no read-modify-write is required for update regardless of object size.

Some example embodiments of the present invention provide a method to implement reliability of a group of key value SSDs. In addition, example embodiments may avoid read-modify-write which happens for block devices in the case that a portion of data within a block is updated because according to example embodiments, reliability is provided per an object (e.g., a variable object), and not per a block (e.g., a fixed block).

According to an example embodiment of the present invention, a storage device includes: a plurality of memory devices configured as a virtual device utilizing stateless data protection; and a virtual device layer configured to manage the virtual device to store objects by applying a first data protection to some of the objects and a second data protection to other ones of the objects depending on respective sizes of the objects.

The memory devices may be configured as one or more data devices and one or more parity devices.

The first data protection may include erasure coding and the second data protection may include replication.

The erasure coding may be utilized for data protection when a corresponding one of the objects is classified as a large object.

The corresponding one of the objects may be classified as the large object when $((P+1)*O>(S+P)*m$ AND $O<=S*m)$, wherein O refers to an object size; P refers to a number of parity devices; S refers to a number of data devices; and m refers to minimum size value allowable.

The replication may be utilized for data protection when a corresponding one of the objects is classified as a small object.

The corresponding one of the objects may be classified as the small object when $((P+1)*O=<(S+P)*m))$, wherein O refers to an object size; P refers to a number of parity devices; S refers to a number of data devices; and m refers to minimum size value allowable.

When a corresponding one of the objects is classified as neither a large object nor a small object, either the erasure coding or the replication may be utilized for data protection based on performance metrics and data use characteristics.

The corresponding one of the objects may be classified as a medium object when $((P+1)*O>(S+P)*m)>S*m>O)$, wherein O refers to an object size; P refers to a number of parity devices; S refers to a number of data devices; and m refers to minimum size value allowable.

The parity devices may be fixed when storing one or more large objects.

The parity devices may rotate when storing one or more large objects.

The memory devices may include solid state drives.

According to another example embodiment of the present invention, a method of utilizing a virtual device layer to store objects in a virtual device including a plurality of memory devices, is provided. The method includes: determining by the virtual device layer whether a corresponding one of the objects is large or small; if the corresponding one of the objects is classified as large: determining a chunk size for erasure coding and an amount of padding of a data chunk of the corresponding one of the objects; calculating P parity chunks using erasure coding; determining the memory devices to store the data and parity chunks; and writing the data and parity chunks to the memory devices, and if the corresponding one of the objects is classified as small: determining the memory devices for data and replicas; and writing the data and the replicas to the memory devices.

The corresponding one of the objects may be classified as medium when it is neither large nor small, and the replication or the erasure coding may be applied based on performance metrics and data use characteristics.

The parity chunks corresponding to at least two of the objects may be stored on a fixed subset of the memory devices.

The parity chunks corresponding to different ones of the objects may not be stored on a fixed subset of the memory devices.

The data and the replicas corresponding to at least two of the objects may be stored on different ones of the memory devices.

At least one of the data chunks may be padded with zeros.

According to another example embodiment of the present invention, a method of reading an object with a key by a virtual device layer from a virtual device including a plurality of memory devices, is provided. The method includes: sending by the virtual device layer to all of the memory devices a request to read; and receiving by the virtual device layer responses from the memory devices, wherein if the object is large, a data chunk and a parity chunk are received by the virtual device layer to rebuild the object utilizing erasure coding, and if the object is small, the data chunk is the object or is replica of the object.

The key may include a hash(key) for determining a start device or a primary device from among the plurality of devices.

BRIEF DESCRIPTION OF THE DRAWINGS

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

While certain embodiments of the present invention have been illustrated and described, it is understood by those of ordinary skill in the art that certain modifications and changes can be made to the described embodiments without departing from the spirit and scope of the present invention as defined by the following claims, and equivalents thereof. For example, features of example embodiments in various drawings may be combined without departing from the spirit and scope of the present invention, as those skilled in the art may appreciate.

DETAILED DESCRIPTION

Figure 1:
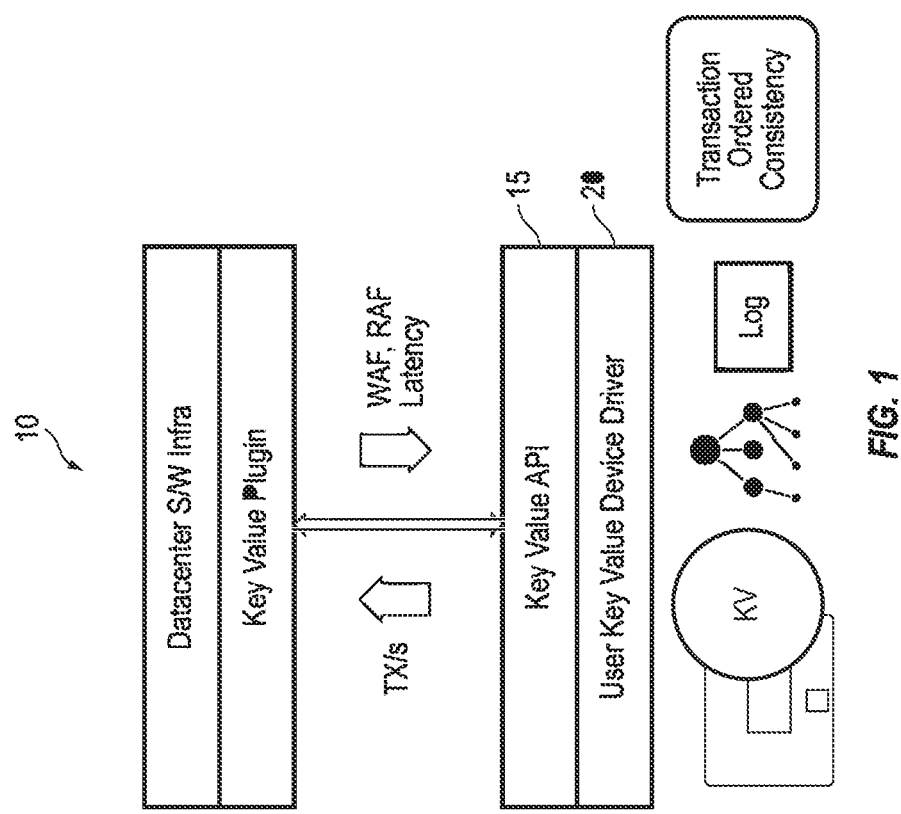
FIG. 1 is a schematic diagram of a key value (KV) solid state drive (SSD) according to example embodiments of the present invention.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components, such as, for example, a host, solid state drives, memory devices, and a virtual device layer, according to embodiments of the present invention described herein, may be implemented utilizing any suitable hardware, firmware (e.g. an application-specific integrated circuit), software, or a suitable combination of software, firmware, and hardware. For example, the various components of these devices, such as key value SSDs, a host, solid state drives, memory devices, and a virtual device layer may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM) or a flash memory (e.g., NAND flash memory) device. The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic diagram of a key value (KV) solid state drive (SSD) 10 according to example embodiments of the present invention. A storage system (or storage device) according to example embodiments includes one or more KV SSDs, such as the one illustrated in FIG. 1, but the present invention is not limited thereto.

According to example embodiments of the present invention, a key value API 15 in the KV SSD 10 operates with a user key value device driver 20 that does not require traditional block mapping.

According to example embodiments of the present invention, the storage system including the KV SSD 10 utilizes a hybrid stateless data protection method by applying a first data protection (e.g., erasure coding) to some of the objects and a second data protection (e.g., replication) to other ones of the objects depending on respective sizes of the objects to achieve desired reliability (e.g., a target reliability). This way, a space-efficient solution may be provided without sacrificing reliability. While the KV SSD 10 itself may perform the hybrid stateless data protection method according to some embodiments, when the hybrid stateless data protection method is performed by the storage system, for example, the management across the drives (SSDs) (e.g., the operation of the virtual device layer) may become easier.

According to example embodiments of the present invention, objects may be classified to result in space efficiency, may be classified based on size, and different backup approaches may be used for each size class.

An object may be considered large if the space overhead of erasure coding for the object is smaller than that of replication for the object. In this case, erasure coding may be desired because it has less space footprint. In other words, when an object satisfies the following inequality, where O is the object value size, $((P+1)*O>(S+P)*m$ AND $O<=S*m)$, an object is considered large. Herein and in inequalities below, O=Object size (i.e., size of the object); P=Parity device count (i.e., the number of parity devices in the virtual device); S=Data device count (i.e., the number of data devices in the virtual device); and m=Minimum size value allowable (i.e., the maximum of all minimum value sizes of individual devices). By way of example, the "Minimum size value allowable" according to example embodiments refers to the value size that can be stored to any device in the system without violating the minimum value size requirement of any device. Each device has the smallest object size that the device supports. Because an object is split into equal size for all devices according to example embodiments, the size should be larger than any smallest sizes that the devices support. If an attempt is made to store an object having a size less than m, at least one device cannot store the object.

In other words, an object is considered large when both of the following conditions are met: 1) the size of the object O multiplied by one more than the number of parity devices (P+1) is larger than the minimum size value allowable m multiplied by the sum S+P of the number of data devices S and the number of parity devices P; and 2) the size of the object O is greater than or equal to the number of data devices S multiplied by the minimum size value allowable m.

According to example embodiments, a large object may be erasure-coded. That is, an object may be split into S chunks (i.e., data chunks or S portions) and the parity chunks (i.e., parity portions) are calculated using the S chunks. Each of the S and P chunks can be stored to a corresponding device as described elsewhere herein.

An object may be considered small when the space overhead of replication for the object is smaller than that of erasure coding for the object. In this case, replication may be desired because it provides better performance for read and can handle updates better than relatively complex erasure coding. This is also reasonable from the observations that application metadata tends to be small. In other words, if an object satisfies the following inequality, $((P+1)*O=<(S+P)*m)$, the object may be considered small and it may be replicated.

In other words, an object may be considered small when the object size O multiplied by one more than the number of parity devices (P+1) is smaller than the sum S+P of the number of data devices S and the number of parity devices P multiplied by the minimum size value allowable m.

There may be some gray area in which an object may be classified as small or large. By way of example, when an object satisfied the following inequality, $((P+1)*O>(S+P)*m)>S*m>O$, the object may be considered to be medium and either replication or erase code may be used based on performance metrics (e.g., space vs. access time) and/or data use characteristics (e.g., update frequency).

In other words, an object may be considered medium when the object size O multiplied by one more than the number of parity devices (P+1) is greater than the sum of the number of data devices (S) and the number of parity devices (P) multiplied by the minimum size value allowable m, which is greater than the number of data devices multiplied by the minimum size value allowable, which is larger than the object size O.

By way of example, if performance is more important and objects are updated frequently, replication may be a better choice. In this case, a medium object may be classified as a small object. For example, in case of the following inequality, $((P+1)*O=<(S+P)*m)$ OR $((P+1)*O>(S+P)*m)$ AND $S*m>0$, i.e., if $((P+1)*O<=(S+P)*m$ OR $O<S*m)$, an object may be classified as small according to example embodiments.

By way of another example, if space efficiency is more important, erasure coding may be used. In this case, a medium object may be classified as a large object. For example, in case the following inequality is satisfied, $((P+1)*O>(S+P)*m$ AND $O<=S*m)$ OR $((P+1)*O>(S+P)*m)>S*m>O=((P+1)*O>(S+P)*m)$, i.e., if $((P+1)*O>(S+P)*m)$, an object may be classified as large according to example embodiments.

Figure 2:
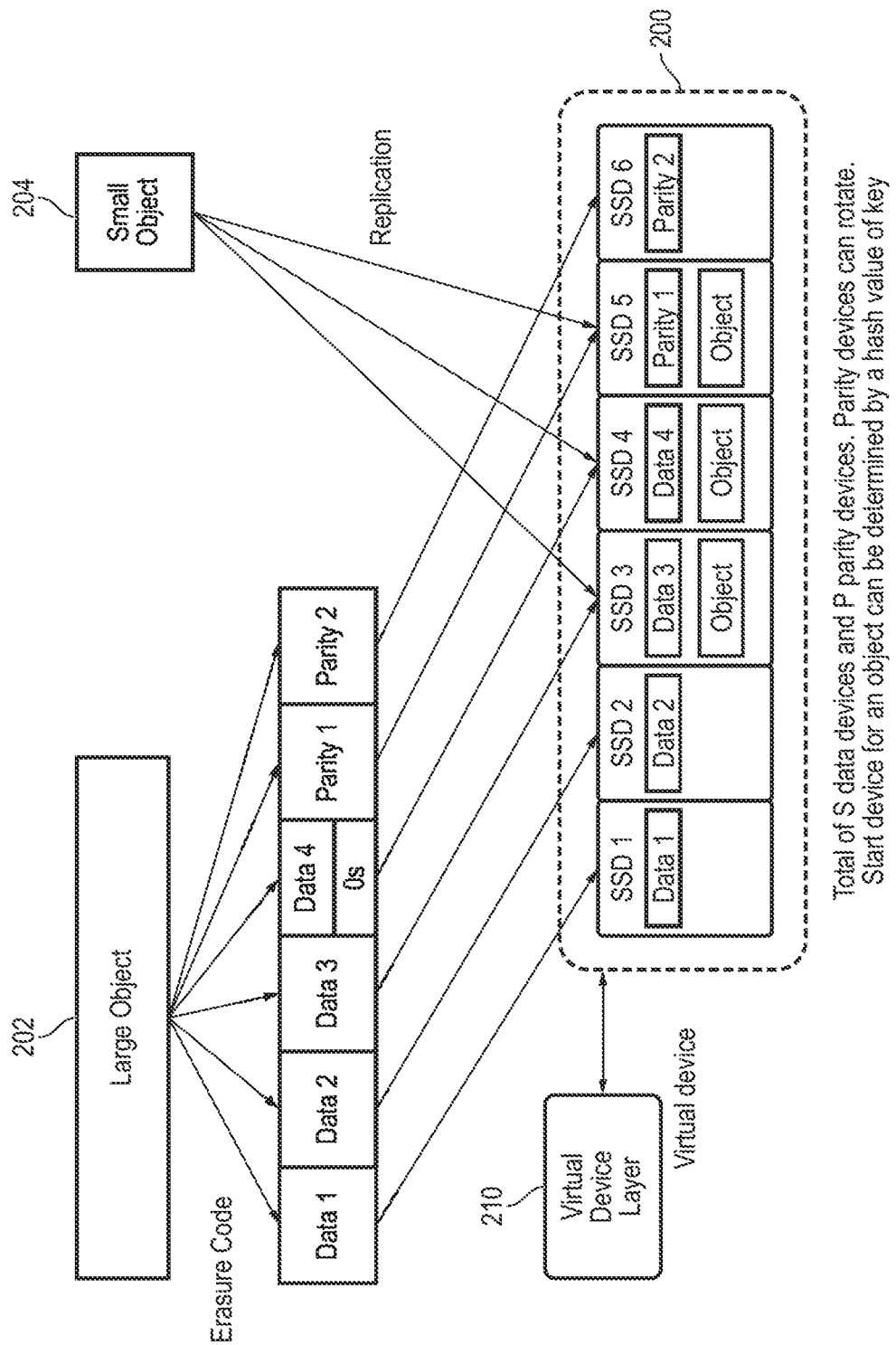
FIG. 2 is a conceptual diagram illustrating a virtual device including a group of devices and storage of objects in the virtual device according to example embodiments.

FIG. 2 is a conceptual diagram illustrating a virtual device 200 including a group of devices (SSD 1, SSD 2, SSD 3, SSD 4, SSD 5, SSD 6) and storage of objects (a large object 202 and a small object 204) in the virtual device 200. Of the devices, SSD 1, SSD 2, SSD 3 and SSD 4 are configured as data devices and SSD 5 and SSD 6 are parity devices. While only four data devices SSD 1, SSD 2, SSD 3, and SSD 4 and two parity devices SSD 5 and SSD 6 are shown in FIG. 2 for illustrative purposes, the number of data and parity devices in the virtual device 200 are not limited thereto. Further, different ones of the solid state drives (SSDs) may be configured as data and parity devices.

By way of example, the virtual device 200 may include a total of S data devices and P parity devices, of which the parity devices can be fixed or can rotate (Thus, one can see in reference to FIG. 2 that the example S value of 4 and the example P value of 2 is used). For instance, when the parity devices can rotate, not all parity chunks (or parity portions) of different large objects may be stored in the same ones of the parity devices, and some of the data devices may be used as parity devices for one or more of the large objects. In other words, when the parity devices are fixed, "P" parity chunks corresponding to the objects are stored on the same set "P" of the memory devices, whereas when the parity devices can rotate, the "P" parity chunks corresponding to the objects are not necessarily stored on the same set of the memory devices. Further, the devices can be organized in a flat manner or in hierarchy. A start device for an object spread or replicated across multiple devices can be determined by a hash value of key.

Further, the data devices may be reconfigured as parity devices and vice versa depending on need and/or user's design choice. By way of example, the number of devices of the virtual device 200 may be configurable based on a reliability target. For erasure coding, the total number of devices may be a sum of the number of data devices (S) and the number of parity devices (P), in order to tolerate P failures. For replication, the total number of devices that can tolerate P failures may be P+1. The capacities of the devices may be the same as or similar to each other.

According to example embodiments of the present invention, the set of devices in (or corresponding to) the virtual device 200 composes a group that is a unit of reliability management. The devices (SSD 1, SSD 2, SSD 3, SSD 4, SSD 5, SSD 6) of the group can exist within a single server or rack, or across servers or racks, and they can be structured to have either a hierarchical architecture or a flat architecture.

The virtual device 200 including the group of devices may be managed by a layer called a virtual device layer 210, such that the group of devices may be presented as a single virtual device. The virtual device layer 210 may be stateless. The virtual device layer 210 may cache and maintain minimum metadata information of devices such as number of objects, available capacity, and/or the like at runtime. Notably, the virtual device layer 210 according to example embodiments does not need to maintain key information (e.g., there is no mapping for keys). The capacity of the virtual device 200 may be determined by the minimum of all device capacities (e.g., the least of the capacities of SSD 1, SSD 2, SSD 3, SSD 4, SSD 5, and SSD 6 in FIG. 2) multiplied by the number of devices in the group.

The virtual device layer 210 may be aware of the minimum value size and the maximum value size that each device can handle. The virtual device layer 210 may determine the minimum and maximum value size for the virtual device 200. For example, according to example embodiments, the maximum of all minimum value sizes of individual devices (m_i) may be defined as the minimum value size (m) of the virtual device 200 while the minimum of all maximum value sizes of individual devices (M_i) may be defined as the maximum value size (M) of the virtual device 200. In other embodiments, the maximum value size (M) of the virtual device may be defined by the minimum of all maximum value sizes of individual devices(M_i) multiplied by the number of the data devices (S).

The virtual device 200 according to some example embodiments of the present invention may utilize any suitable erasure coding algorithms known to those skilled in the art, and may use an available maximum distance separable (MDS) algorithm, such as, for example, Reed-Solomon (RS) code. As can be seen in FIG. 2, an erasure code (EC) with a parity value of two (i.e., the erasure coding algorithm) is applied to the large object 202, such that Parity 1 and Parity 2 are used.

According to example embodiments, an object (e.g., the large object 202) may be split into S chunks and encoded (of same size and distributed over the data and parity devices (i.e., S+P devices)). By way of example, the large object 202, which has been erasure coded, may be split into Data 1, Data 2, Data 3, Data 4, Parity 1 and Parity 2. The actual storage space that an object occupies may be referred to as a band according to example embodiments. A band may span over S+P devices for erasure coding, while a band may span over P+1 devices for replication. For example, replication is applied to the small object 204. A band may contain an object fully (i.e., an entire object may be stored in a band). In some embodiments, the band may span over S devices in which S chucks of the object are stored.

When an object size is not aligned to the allocation or alignment unit of a device, extra space allocated for an object in a band may be padded (e.g., may be padded with 0s). By way of example, FIG. 2 shows that Data 4 of the large object 202 has been padded with 0s to occupy extra space not necessary for storing all data bits of Data 4. Further, the band size may be variable according to embodiments of the present invention.

Figure 3:
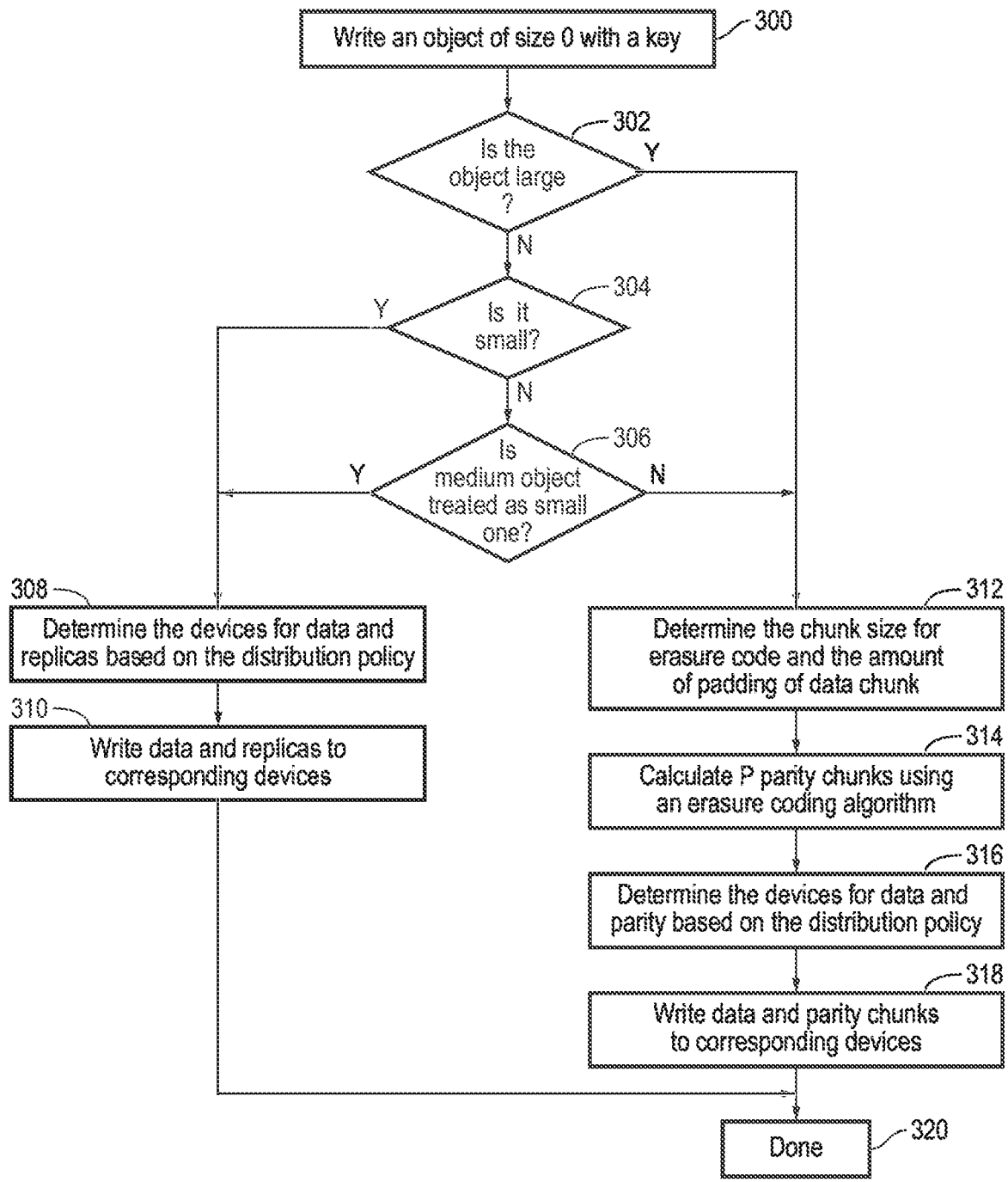
FIG. 3 is a flow diagram for writing an object to a virtual device according to example embodiments of the present invention.
Figure 4:
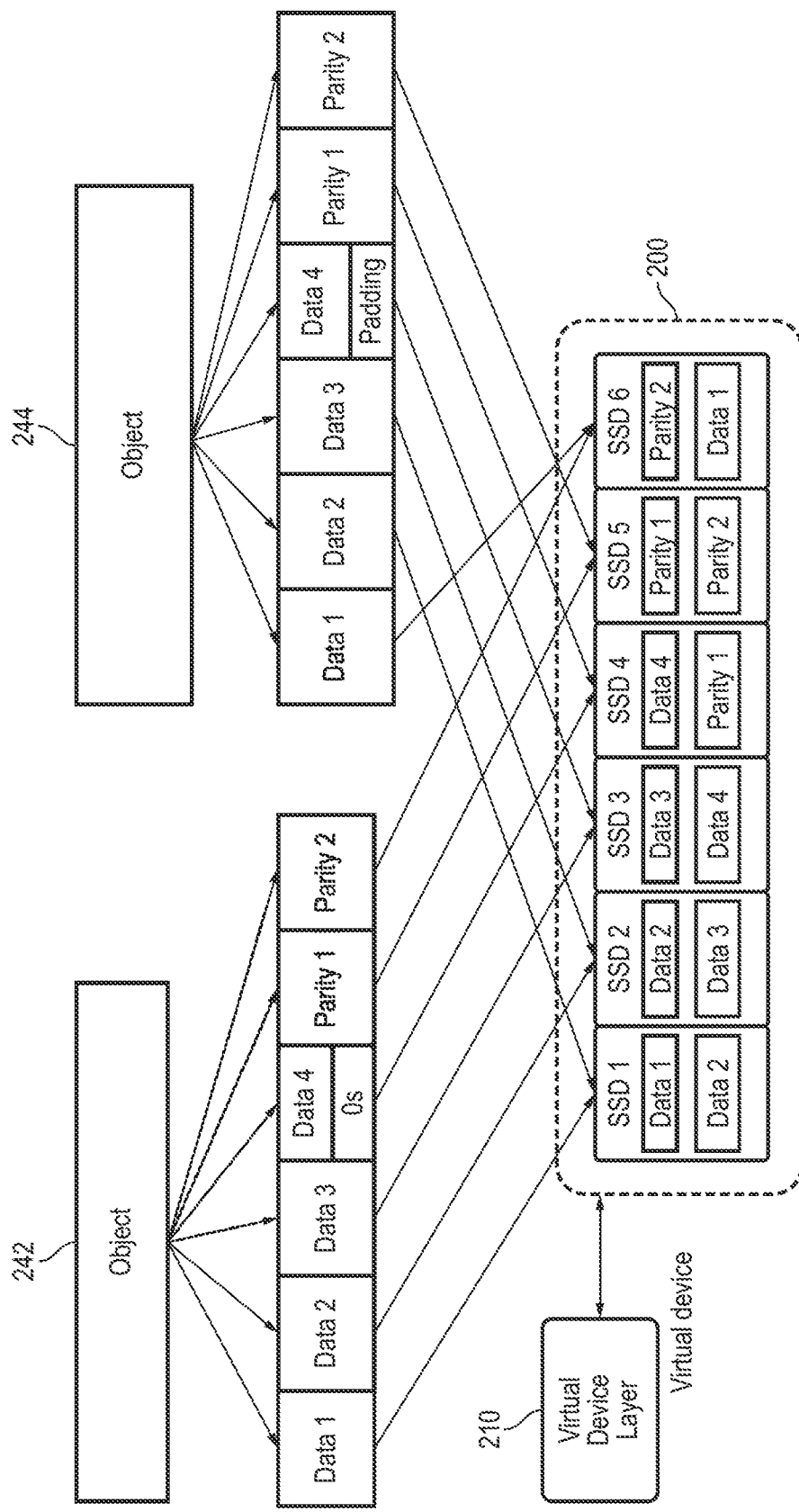
FIG. 4 is a conceptual diagram illustrating storage of large objects in a virtual device of FIG. 2 in a shared parity manner according to example embodiments.
Figure 5:
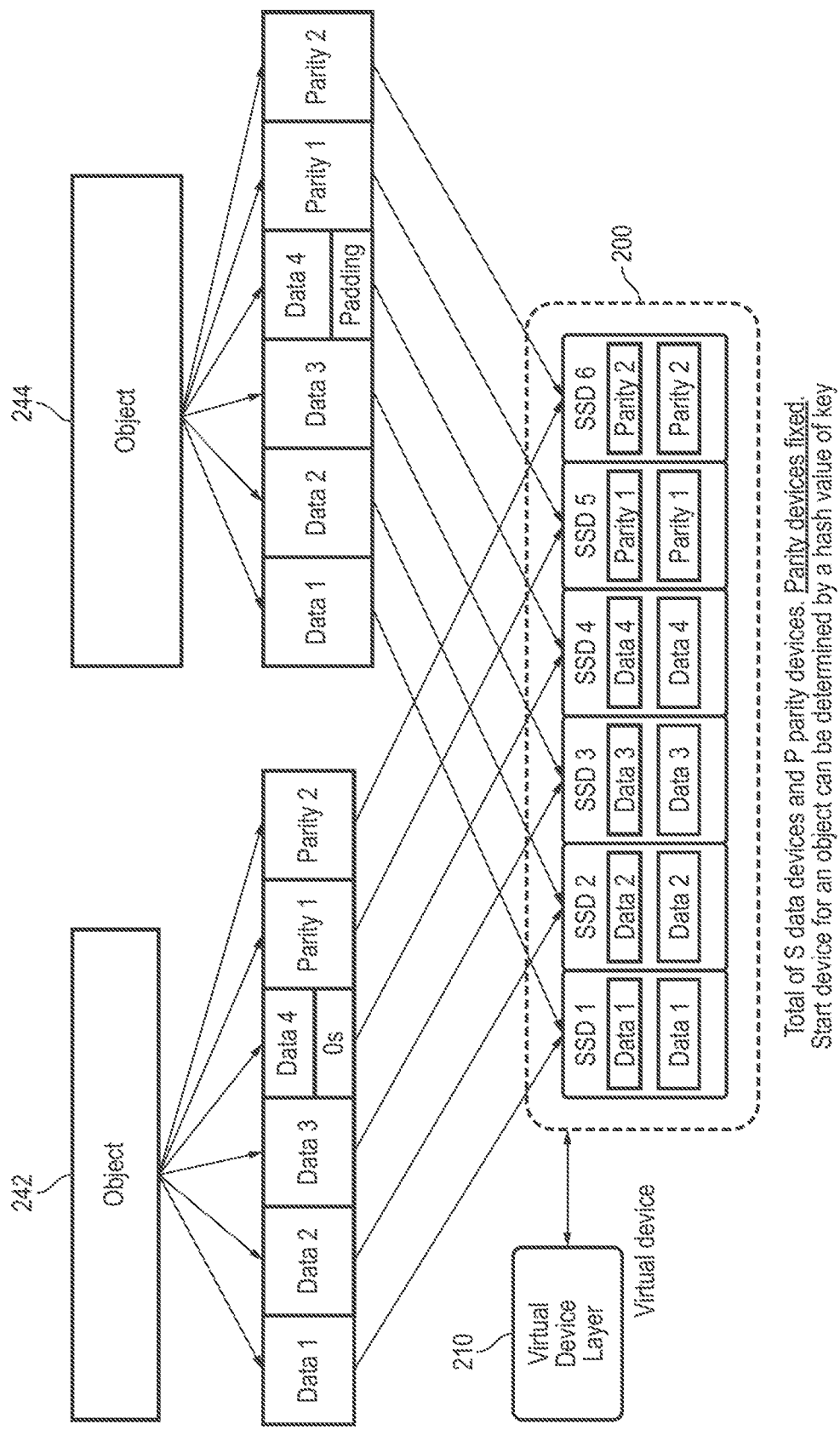
FIG. 5 is a conceptual diagram illustrating storage of large objects in a virtual device of FIG. 2 in a dedicated parity manner according to example embodiments.
Figure 6:
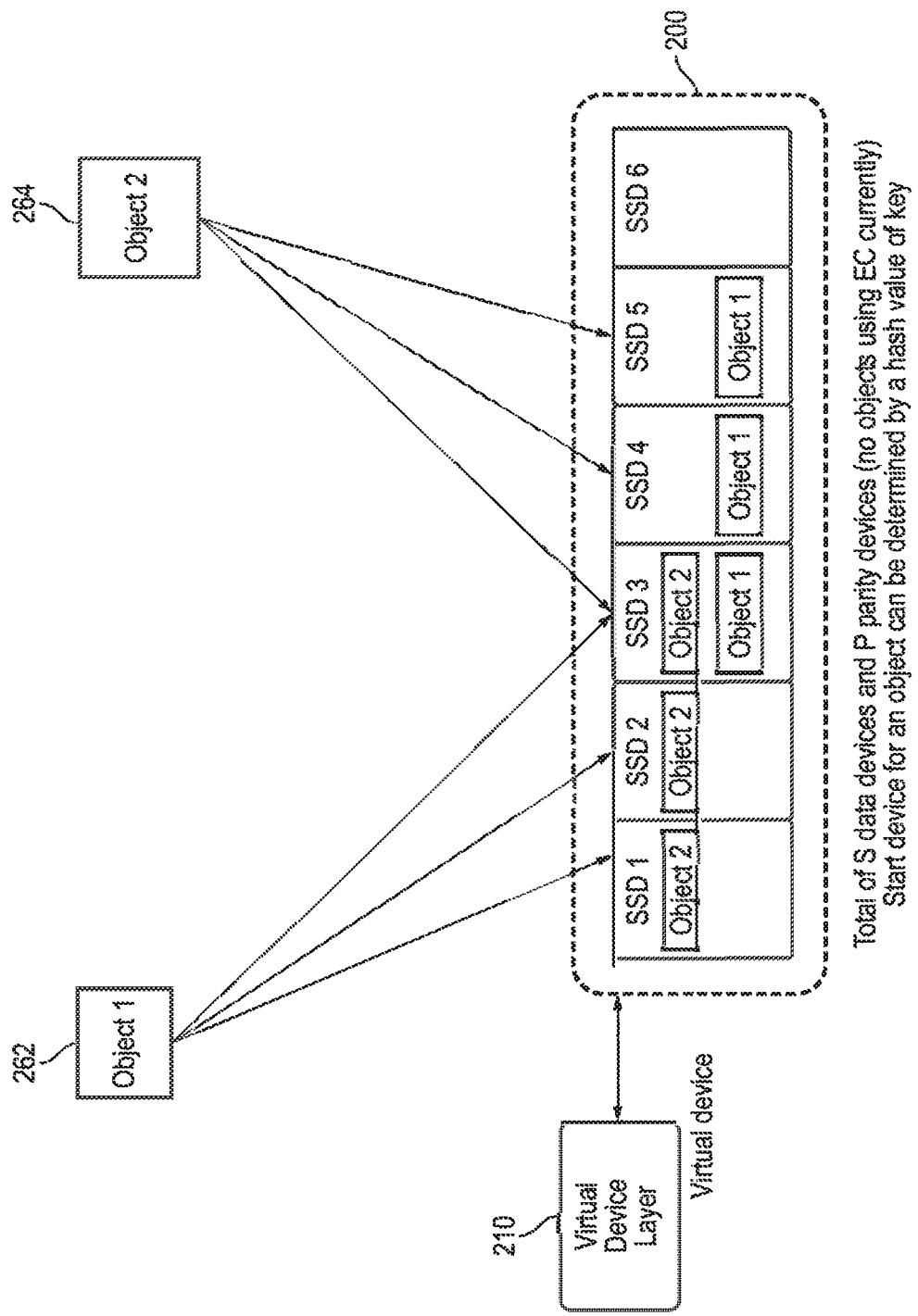
FIG. 6 is a conceptual diagram illustrating storage of small objects in a virtual device of FIG. 2 according to example embodiments.

FIG. 3 is a flow diagram for writing an object to a virtual device (e.g., the virtual device 200 of FIGS. 2 and 4-6) according to example embodiments of the present invention. FIG. 4 is a conceptual diagram illustrating storage of large objects 242 and 244 in the virtual device 200 in a shared parity manner according to example embodiments of the present invention. FIG. 5 is a conceptual diagram illustrating storage of large objects 242 and 244 in the virtual device 200 in a dedicated parity manner according to example embodiments of the present invention. FIG. 6 is a conceptual diagram illustrating storage of small objects 262 and 264 in the virtual device 200 according to example embodiments of the present invention.

As can be seen in FIG. 3, in box 300, a virtual device layer (e.g., the virtual device layer 210 of FIGS. 2 and 4-6) receives (e.g., from a host) instructions or a command to write an object of size O with a key to a virtual device (e.g., the virtual device 200 of FIGS. 2 and 4-6). In other embodiments, the write instructions or command may be generated by the virtual device layer in response to write instructions provided by the host.

In box 302, the virtual device layer determines whether the object is large using the inequality discussed above. For example, an object is considered large when ((P+1)*O>(S+P)*m AND O⇐S*m), wherein O=Object size; P=Parity device number; S=Data device number; and m=Minimum size value allowable (i.e., the maximum of all minimum value sizes of individual devices).

When the object is classified as a large object, as shown in box 312, the virtual device layer determines the size of data chunks for erasure coding and the amount of padding (e.g., padding with zeros) for one or more of the data chunks. Then, the object is split into S chunks of same size, considering alignment with padding, and then as shown in box 314, P code chunks (i.e., P parity chunks) are generated (e.g., calculated) from S chunks utilizing a suitable erasure coding algorithm known to those skilled in the art.

Then in box 316, the virtual device layer determines the devices (i.e., S devices and P devices) for storing data chunks and parity chunks based on the distribution policy. For example, the distribution policy may involve determining a start device for an object by a hash value of the key and/or storing data and/or parity chunks on fixed devices and/or spots. In box 318, the data chunks and the parity chunks are written to corresponding devices. By way of example, S+P chunks are distributed for storage in the S+P devices (e.g., SSD 1, SSD 2, SSD 3, SSD 4, SSD 5, and SSD 6 of FIG. 2). For a rotating parity device shown in FIG. 4, for example, data writing starts at a device determined with a hash of the key, and each block, i.e., chunk (and parity block, i.e., parity chunk), is written in turn starting with the first data on the first device. For a fixed parity device as illustrated in FIG. 5, for example, all data and parity blocks (i.e., chunks) are stored in pre-assigned devices. Here, the start device is pre-assigned as well. For small objects, the start device and replica devices are also determined by hashing the key.

As can be seen in FIG. 4, the parity devices can be shared (i.e., rotate). In other words, a single device can be used as both a data device for storing a data chunk or a parity device for storing a parity chunk depending on the large object being stored. By way of example, the object 242 may be split into Data 1, Data 2, Data 3, Data 4 (with padded 0s), Parity 1 and Parity 2, and the object 244 also may be split into Data 1, Data 2, Data 3, Data 4 (with padded 0s), Parity 1 and Parity 2. It can be seen in FIG. 4 that while Data 1, Data 2, Data 3, and Data 4 of the large object 242 are stored in SSD 1, SSD 2, SSD 3, and SSD 4, respectively, of the virtual device 200, Data 1, Data 2, Data 3, and Data 4 of the large object 244 are stored in SSD 6, SSD 1, SSD 2, and SSD 3, respectively, of the virtual device 200.

Further, while Parity 1 and Parity 2 of the object 242 are stored in SSD 5 and SSD 6, respectively, of the virtual device 200, Parity 1 and Parity 2 of the object 244 are stored in SSD 4 and SSD 5, respectively, of the virtual device 200. Therefore, while there are a total of S data devices and P parity devices, the parity devices can rotate, such that there are no dedicated parity devices.

Unlike the example depicted in FIG. 4, FIG. 5 illustrates an implementation utilizing dedicated parity devices, namely, SSD 5 and SSD 6 of the virtual device 200. By way of example, Data 1, Data 2, Data 3, Data 4 (with padded 0s), Parity 1, and Parity 2, of both the large object 242 and the large object 244 are respectively stored in SSD 1, SSD 2, SSD 3, SSD 4, SSD 5, and SSD 6 of the virtual device 200.

For rotating parity embodiments, and for small objects, the start device for an object can be determined by a hash value of the key. For example, the start device can be determined by Hash(key) % (S+P) in the shared parity device case of FIG. 4. Then, the subsequent data and parity chunks (i.e., S+P chunks) are sequentially written to (Hash(key)+1)% (S+P), (Hash(key)+2)% (S+P), (Hash(key)+S+P−1)% (S+P). If there are dedicated parity devices, S devices are used instead of (S+P).

After the data and parity chunks are written to the corresponding devices the large object writing process is completed (i.e., done) in box 320.

When the object is not determined to be large in box 302, the process proceeds to box 304 in which a determination is made as to whether the object is small, (i.e., whether ((P+1)*O=<(S+P)*m)). If the object is determined to be small, the virtual device layer proceeds to perform replication and determines in box 308, which devices are utilized to store data and replicas based on the distribution policy. For example, the distribution policy may involve determining a start device for an object by a hash value of the key and/or storing data and/or replicas on fixed devices and/or spots. Then in box 310, the data and replicas are written to corresponding devices.

According to example embodiments, P+1 replicas (including one data copy and P parity copies) may be created for an object, considering alignment with padding, and they may be distributed over P+1 devices. As illustrated in FIG. 6, for example, Object 1 262 is replicated 3 times (including data and 2 replicas) and the copies are stored in SSD 1, SSD 2, and SSD 3, respectively, of the virtual device 200. Similarly, Object 2 264 is replicated 3 times (including data and 2 replicas) and the copies are stored in SSD 3, SSD 4, and SSD 5, respectively, of the virtual device 200. In the example shown in FIG. 6, the virtual device 200 includes a total of S data devices and P parity devices. Further, because both the object 1 262 and the object 2 264 are small objects, no erasure coding is used in the example illustrated in FIG. 6.

The primary device may be selected using a hash value of key over S+P devices. P replicas may be deterministically selected based on storage organization, performance, and/or the like. For example, while data may be stored in the primary device, replicas may be stored on (Hash(key)+1)% (S+P), (Hash(key)+2)% (S+P), . . . , (Hash(key)+P) % (S+P), or on different node, racks regardless of whether dedicated parity devices are used or not.

Returning now to FIG. 3, when the object is determined to be not small in box 304, i.e., when the object is neither large (see box 302) nor small (see box 304), the object is determined to be a medium object (i.e., (P+1)*O> (S+P)*m>S*m>O), and the process proceeds to box 306 to determine whether the medium object is to be treated as a small object. If the object is to be treated as a small object, the process proceeds to box 308 to initiate the small object storage process, and if the object is to be treated as a large object, the process proceeds to box 312 to initiate the large object storage process.

Figure 7:
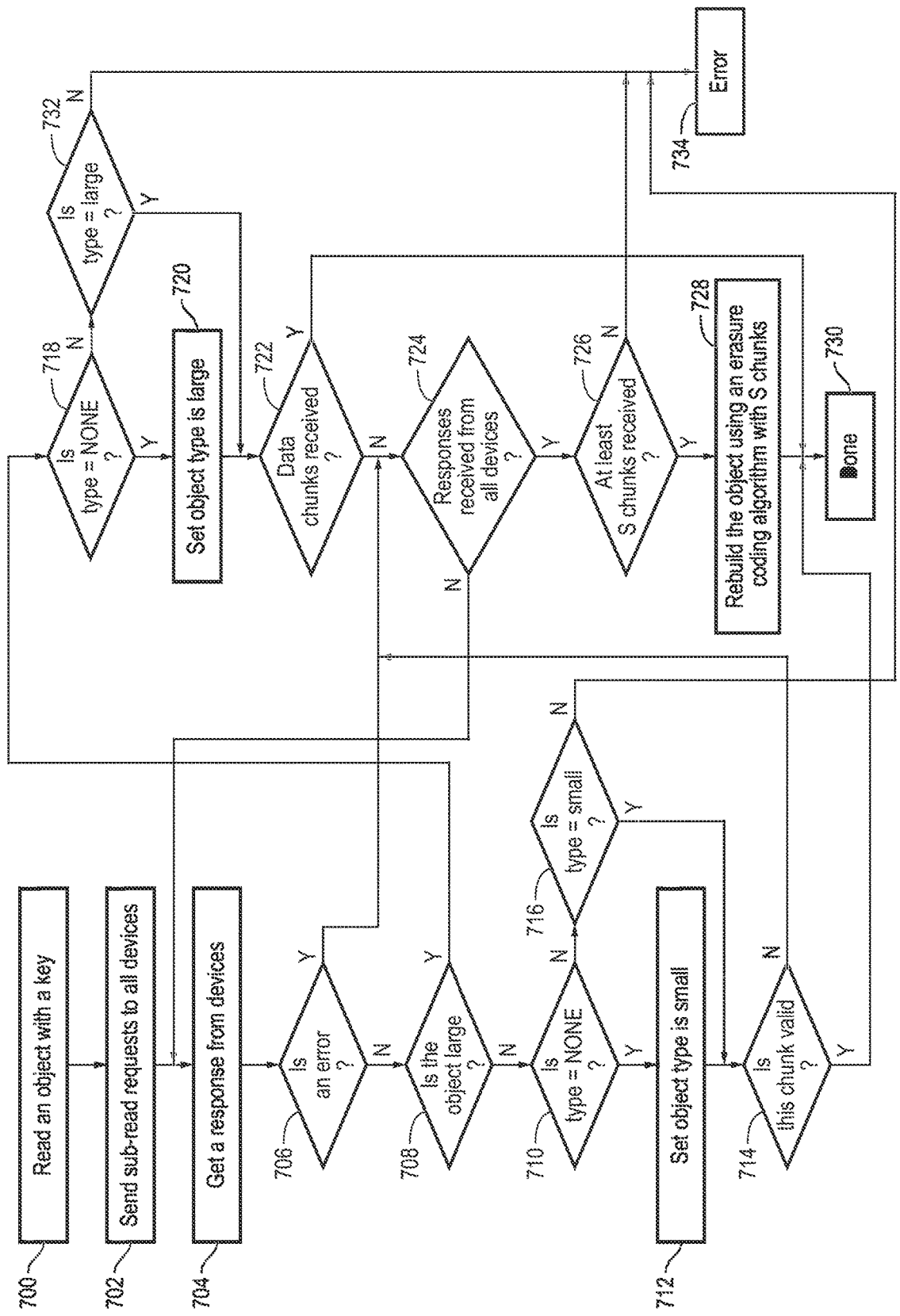
FIG. 7 is a flow diagram for reading an object from a virtual device according to example embodiments of the present invention.

FIG. 7 illustrates a process of reading an object from a virtual device (e.g., the virtual device 200 of FIGS. 2 and 4-6) according to example embodiments of the present invention. A virtual device layer (e.g., the virtual device layer 210 of FIGS. 2 and 4-6) does not know whether an object to read is small or large because it does not maintain object metadata such as key and value size. Therefore, the virtual device layer initiates a reading process (700) by sending a read request to all physical devices (i.e., S+P devices) using the user key of the object, in which sub-read requests are sent to all physical devices as shown in box 702. The virtual device layer receives responses from the devices in box 704. When the object that the user (e.g., the host) requests is large, all of the S+P devices return respective responses to the requests with the user key if there is no error, which is determined in box 706.

By way of example, if the object to be read is a large object, then all devices (i.e., S+P devices) will respond when there is no error. However, only S+P−N devices may respond when N devices have error. As long as the virtual device layer receives any S chunks (i.e., any combination of data chunks S and parity chunks P equal to the total number of data chunks S) of same size, it is able to rebuild the user object. In other words, as long as no more than the parity number of devices (i.e., the number of device equal to P) fail, data can be rebuilt in the case of large objects.

If the total number of received chunks is smaller than S or the size of chunks is not same, there are errors. It could be a read of a non-existing object in the case that all devices return NON_EXIST error, or an unrecoverable error could have happened.

Initially the virtual device layer does not know the object type, so it initializes the type as NONE. When the object is large as determined in box 708, a type is determined in box 718. If the type is NONE, the object type is set to be large in box 720. If the type is not determined to be NONE in box 718, in box 732, the virtual device layer checks if the type is large. If the type is not large in box 732, an error is determined as shown in box 734. After the object type is set to be large in box 720 or if the object type is determined to be large in box 732, the virtual device layer determines if it has all data chunks in box 722.

If the virtual device layer determines that all data chunks have been received, the reading process is completed (i.e., Done) as shown in box 730. If not all data chunks have been received, the virtual device layer determines in box 724 if responses have been received from all devices. If all devices have responded, the virtual device layer determines if it has at least S chunks (counting all of data chunks and parity chunks) of data in box 726. If less than S chunks have been received, the virtual machine layer determines that there is an error as shown in box 734. If at least S chunks (counting all received data chunks and parity chunks) have been received accurately, the virtual device layer rebuilds the object using an erasure coding algorithm with S chunks in box 728, and the reading process is completed in box 730. It may be possible for one or more devices to not respond, for example, in case one or more devices are unexpectedly offline. Hence, in some example embodiments, even if not all devices respond, as long as at least S chunks have been received, the virtual device layer proceeds to rebuild the object as illustrated in box 728.

If the virtual device layer determines in box 708 that the object is not large, the process proceeds to box 710 to determine whether the type is NONE. If the type is NONE, the object type is set to small in box 712. If the type is not NONE, a determination is made in box 716 whether the type is small. Here, if the type is not small, an error is found as shown in box 734. After the object type is set to small in box 712 or if the virtual device layer determines that the type is small in box 716, the virtual device layer determines if the received chunk is valid in box 714. If the received chunk is valid, the reading process is completed (i.e., done) as shown in box 730.

When the object that the user (e.g., a host) requests is small, P+1 devices that have a replica (i.e., one of the primary copy and replicas) will return if there is no error while the others return an error informing that the object does not exist. As long as the virtual device layer receives any valid chunk in box 714, it has the object. If all devices return NOT_EXIST error, such object does not exist (or there is an error). If not all devices return but all the returned devices reports NOT_EXIST, an unrecoverable error has happened as shown in the box 734.

If the virtual device layer determines that the chunk is not valid in box 714, a determination is made in box 724 as to if responses have been received from all devices. If responses have not been received from all devices, the virtual device layer proceeds to get responses from all devices in box 704 and continues with the process to determine whether or not there is an error in box 706 and so forth, as shown in FIG. 7.

According to example embodiments of the present invention, the virtual device layer may ask each device to enumerate all object keys and have a total order over all keys conceptually for reconstruction in case of a failed read. The virtual device layer may check the keys one by one in an order.

If the object is large, the virtual device layer can determine the start device for the key by using Hash(key) and which chunk should be created (data chunk or code chunk) based on the start device information in the case that no fixed parity device is used. In the case that a parity device is used, it is obvious which chunk must be reconstructed. The chunk for the new device is reconstructed with valid chunks similar to the large object read case.

If the object is small, the virtual device layer can determine the primary device for the key by using Hash(key) and which devices have the replicas, based on the primary device information. If the new device must have the replica, the object is written to the new device. It repeats until all objects across devices are visited and the failed device is reconstructed.

As such, according to one or more example embodiments of the present invention, a stateless hybrid of erasure coding and replication is utilized based on space overhead. Further, medium size objects can switch between erasure coding and replication, based on access pattern, for example. In addition, the chunk size is variable per object. Further, no read-modify-write due to sharing space with other objects may be necessary.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A storage device comprising:
a memory device configured as a virtual device and having a storage-size threshold, which is defined by an object size that the memory device is configured to store; and
a virtual device layer configured to manage the virtual device to store an object by applying a first data protection to the object, based, at least in part, on the size of the object and a value size threshold, wherein the value size threshold corresponds to a value size that can be stored to the memory device in conformance with a value size requirement of the memory device, wherein the virtual device layer is configured to:
apply the first data protection to the object in response to a determination that the object is larger than a first size threshold based in part on the object size and the value size threshold.

2. The storage device of claim 1, wherein the virtual device layer is further configured to: apply a second data protection to the object in response to a determination that the object is smaller than a second size threshold based in part on the size of the object and the value size threshold.

3. The storage device of claim 2, wherein the virtual device layer is configured to: apply one of the first data protection or the second data protection to the object in response to a determination that the object is smaller than the first size threshold and larger than the second size threshold based in part on the object size and the value size threshold.

4. The storage device of claim 3, wherein the memory device comprises a set of memory devices comprising one or more data devices and one or more parity devices.

5. The storage device of claim 4, wherein the parity devices are a fixed subset of the set of memory devices.

6. The storage device of claim 4, wherein the parity devices comprise a changing subset of the set of memory devices, and wherein the set of memory devices are configured to individually operate as both a data device and as a parity device.

7. The storage device of claim 2, wherein the first data protection comprises erasure coding and the second data protection comprises replication.

8. The storage device of claim 7, wherein the object is defined as being larger than the first size threshold in response to: one more than a number of parity devices multiplied by an object size is greater than a largest value of the value size threshold from among the respective value size thresholds of the set of memory devices multiplied by a sum of a number of data devices and the number of parity devices; and the object size is greater than or equal to the number of data devices multiplied by the largest value of the value size threshold from among the respective value size thresholds of the set of memory devices.

9. The storage device of claim 7, wherein the object is defined as being smaller than the second size threshold in response to: one more than a number of parity devices multiplied by an object size is less than or equal to a largest value of the value size threshold from among the respective value size thresholds of the set of memory devices multiplied by a sum of a number of data devices and the number of parity devices.

10. The storage device of claim 7, wherein in response to the object being defined as being smaller than the first size threshold and being larger than the second size threshold, either the first data protection or the second data protection is utilized for data protection based on one or more of space available on the set of memory devices, access time for the object when stored on the virtual device, and how frequently the object is accessed.

11. The storage device of claim 7, wherein the object is defined as smaller than the first size threshold and larger than the second size threshold in response to: one more than a number of parity devices multiplied by an object size is greater than a largest value of the value size threshold from among the respective value size thresholds of the set of memory devices multiplied by a sum of a number of data devices and the number of parity devices is greater than the number of data devices multiplied by the largest value of the value size threshold from among the respective value size thresholds of the set of memory devices is greater than the object size.

12. The storage device of claim 2, wherein the memory devices comprise solid state drives.

13. A method of utilizing a virtual device layer to store objects in a virtual device comprising a plurality of memory devices, each of the memory devices having a value size threshold, wherein the value size threshold corresponds to a value size that can be stored to the memory device in conformance with a value size requirement of the memory device, the method comprising:
receiving by the virtual device layer an object to be stored;
defining by the virtual device layer a storage size of the object based in part on the object size and the value size threshold;
in response to a determination that the storage size of the object is larger than a first size threshold:
determining a chunk size for erasure coding and an amount of padding of a data chunk of the object;
partitioning the object into a plurality of data chunks each having the chunk size for the erasure coding;
calculating P parity chunks using the erasure coding;
determining the memory devices to store the data and parity chunks; and
writing the data and parity chunks to the memory devices.

14. The method of claim 13, wherein the method further comprises, in response to a determination that the storage size of the object is smaller than a second size threshold:
determining the memory devices for data and replicas; and
writing the data and the replicas to the memory devices.

15. The method of claim 14 wherein, in response to a determination that the storage size for the object is smaller than the first size threshold and larger than the second size threshold, the replication or the erasure coding is applied based on one or more of space available on the plurality of memory devices, access time for the object when stored on the virtual device, and how frequently the object is accessed.

16. The method of claim 14, wherein the parity chunks corresponding to the object are stored on a fixed subset of the memory devices.

17. The method of claim 14, wherein the parity chunks corresponding to the object are stored on a variable subset of the memory devices.

18. The method of claim 14, wherein the data and the replicas corresponding to the object are stored on different ones of the memory devices.

19. The method of claim 14, wherein at least one of the data chunks is padded with zeros.

20. A method of reading an object with a key by a virtual device layer from a virtual device comprising a plurality of memory devices, each of the memory devices having a value size threshold, wherein the value size threshold corresponds to a value size that can be stored to the memory device in conformance with a value size requirement of the memory device, the method comprising:
receiving by the virtual device layer the key corresponding to a data read request;
sending by the virtual device layer to all of the memory devices a request to read; and receiving by the virtual device layer responses from the memory devices, wherein:
the received response is a data chunk and a parity chunk that are received by the virtual device layer to rebuild the object utilizing a first data protection when the storage size of the object is larger than a first size threshold.

21. The method of claim 20, wherein the received response is the object or is a replica of the object utilizing a second data protection when the storage size of the object is smaller than a second size threshold.

22. The method of claim 21, wherein the first data protection comprises erasure coding and the second data protection comprises replication.

23. The method of claim 21, wherein the key comprises a hash(key) for determining a start device or a primary device from among the plurality of devices.

24. A storage device comprising:
a set of memory devices configured as a virtual device, having a value size threshold, wherein the value size threshold corresponds to a value size that can be stored to the memory device in conformance with a value size requirement of the memory device; and
a virtual device layer configured to manage the virtual device to store a first object and a second object, wherein the first object is larger than the second object, by applying one of a first data protection and a second data protection to the first object and the second object, respectively,
wherein the virtual device layer is configured to:
apply the first data protection to the first object;
apply the second data protection to the second object;
store the first object within a first subset of the set of memory devices, the first subset of the set of memory devices having a first starting memory device as determined by hashing a first key associated with the first object; and
store the second object within a second subset of the set of memory devices, the second subset of the set of memory devices having a second starting memory device as determined by hashing a second key associated with the second object.

25. The method of claim 24, wherein the virtual device layer is further configured to:
apply either the first data protection or the second data protection to a third object that is larger than the second object and smaller than the first object; and
store the third object within a third subset of the set of memory devices, the third subset of the set of memory devices having a third starting memory device as determined by a hash of a third key associated with the third object.

* * * * *